April 8, 1969 HUA-THYE CHUA 3,437,844
FLIP-FLOP CIRCUIT INCLUDING COUPLING TRANSISTORS AND STORAGE CAPACITORS TO REDUCE CAPACITOR RECOVERY TIME
Filed Jan. 27, 1966
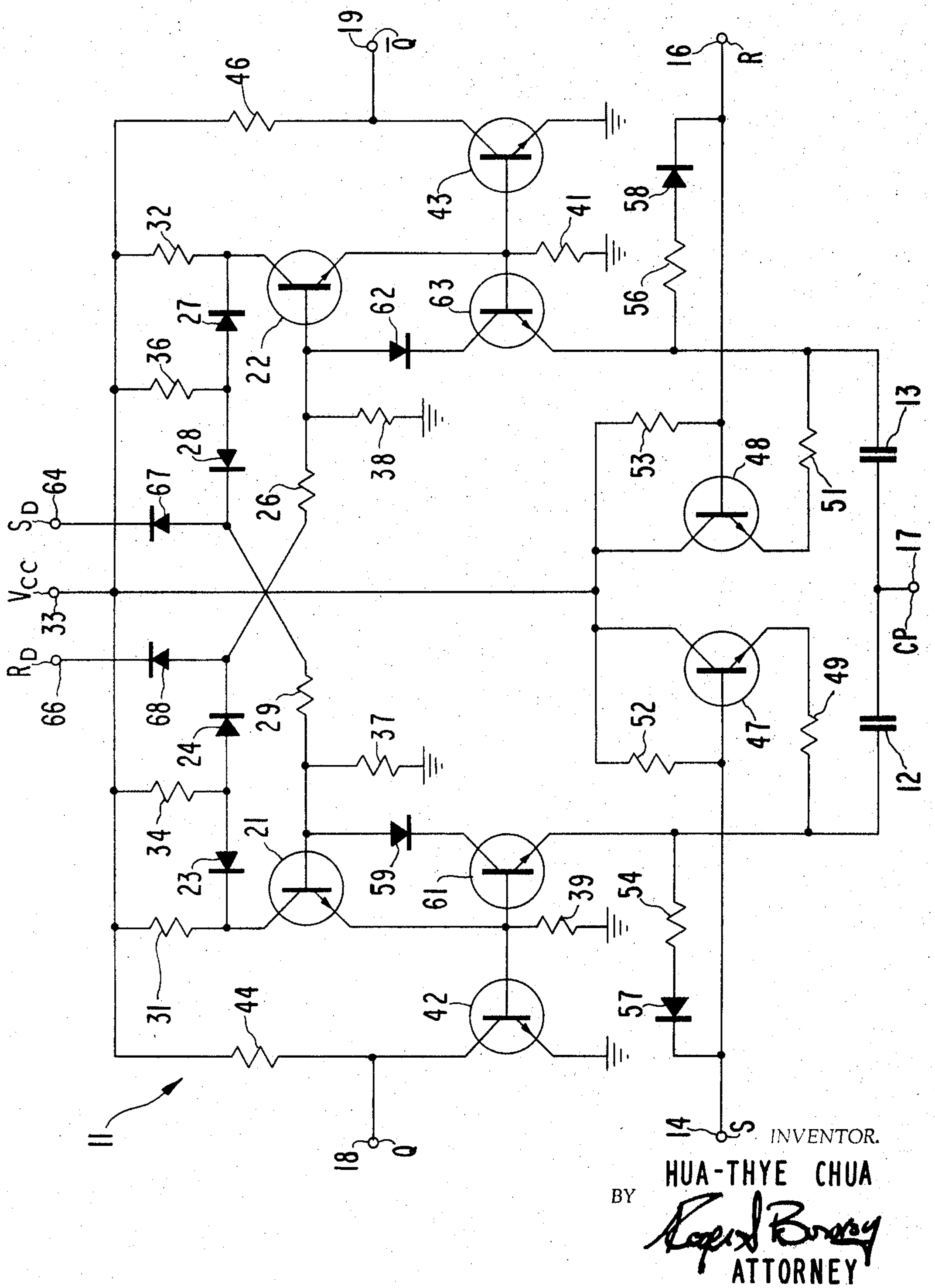
INVENTOR.
HUA-THYE CHUA
BY [signature]
ATTORNEY 3,437,844

FLIP-FLOP CIRCUIT INCLUDING COUPLING TRANSISTORS AND STORAGE CAPACITORS TO REDUCE CAPACITOR RECOVERY TIME

Hua-Thye Chua, Sunnyvale, Calif., assignor to Fairchild Camera and Instrument Corporation, Syosset, N.Y., a corporation of Delaware Filed Jan. 27, 1966, Ser. No. 523,445
Int. Cl. H03k 3/281
U.S. Cl. 307—292 15 Claims

ABSTRACT OF THE DISCLOSURE

A flip-flop circuit including a pair of flip-flop transistors, a pair of coupling transistors, a pair of buffered transistors, and a pair of storage capacitors, all of which are connected to produce a reduced capacitor recovery time and minimum loading.

This invention relates generally to pulsed binaries of the type employing a buffered bistable flip-flop as a permanent storage element and capacitors as temporary storage elements, and is more particularly directed to a binary of this type having a novel coupling circuit for transferring stored information from the capacitors into the flip-flop with minimum delay and thereafter rapidly restoring the capacitors to their normal conditions so that new information may be entered without delay.

Various solid state pulsed binary circuits are known which have a bistable flip-flop serving as a permanent storage element, and a pair of capacitors serving as temporary storage elements. The capacitors are coupled to the flip-flop to transfer temporarily stored information to the flip-flop upon the command of a clock pulse. In addition, it is the usual practice to provide buffer transistors driven by the flip-flop transistors in order to achieve a suitably large load-driving capacity. The potential voltage variation between the "on" and the "off" states determine the levels of the output pulse waveforms. With such a circuit, two major difficulties have been encountered.

First, the speed with which the buffer transistors can be switched on and off by the flip-flop transistors has been limited even though the flip-flop transistors may themselves be switched relatively rapidly. Second, the speed with which the temporary storage capacitors may be restored to their original condition subsequent to transfer of information to the flip-flop transistors has been slow in previous pulsed binary circuits. This arises from compromising the size of the load resistors employed in coupling set and reset signals to the temporary storage capacitors in order to minimize loading of the drivers which provide such signals during capacitor recovery. Where the resistors are too small, excessive loading of the drivers results. Where the resistors are too large, capacitor recovery time is relatively long. It has therefore been the usual practice to compromise the size of the resistors between the two extremes with the result that recovery of the capacitors is not as fast as desired, and the devices are still somewhat heavily loaded.

Past attempts to overcome these problems and to provide a very high speed pulsed binary have been unsuccessful.

Briefly, the invention relates to an improvement in a buffered flip-flop circuit having a first and second cross-coupled flip-flop transistors. Each of the transistors has an emitter, a base, and a collector. The circuit has: three input terminals, one being for receipt of clock pulses, and the others being for receipt of set and reset input signals; a pair of temporary storage capacitors each having two terminals, one coupled between the clock pulse input terminal and the base of one of the flip-flop transistors, and the other coupled between the clock pulse input terminal and the base of the other of the flip-flop transistors; and a pair of buffer transistors, each having an emitter, a base, and a collector, coupled to the emitters of the flip-flop transistors. The improvement of the invention comprises a pair of means coupling the set input terminal to the terminal of one of the capacitors which is coupled to the base of one of the flip-flop transistors, and coupling the reset input terminal to the terminal of the other of the capacitors which is coupled to the base of the other of the flip-flop transistors. Each of the pair of coupling means includes the emitter-base junction of a coupling transistor and a resistance in series with the junction. Both the coupling transistors are biased to provide current gain. This improvement lessens capacitor recovery time and also minimizes loading.

An additional improvement uses a second pair of coupling transistors each having a base, an emitter, and a collector, the emitter-collector circuits of each of the second pair of coupling transistors couples the base of one of the flip-flop transistors to one terminal of one of said capacitors, and the emitter-base circuits of each of the second pair of coupling transistors couples the base of one of the buffer transistors to the same terminal of one of the capacitors to which the base of a flip-flop transistor is coupled. This improvement shortens the switching time of the circuit.

Other aspects of the invention will become apparent upon consideration of the following description of the invention in conjunction with the accompanying drawing wherein the sole figure is a schematic circuit diagram of a preferred embodiment of a high speed pulsed binary circuit in accordance with the invention.

Referring now to the drawing, the high speed pulsed binary of the present invention will be seen to include a buffered flip-flop 11 with temporary storage capacitors 12 and 13 coupled thereto. The capacitors are arranged to receive digital information from synchronous set and reset terminals 14 and 16 and to temporarily store the information until a clock pulse is received at a clock pulse input terminal 17. Responsive to a clock pulse, the information temporarily stored by the capacitors is transferred to the flip-flop to correspondingly switch their state. The state of the flip-flop is indicated by the signal appearing at direct or complementary output terminals 18 and 19.

Flip-flop 11 preferably includes a pair of transistors 21 and 22 which in the illustrated case, are depicted as NPN (although PNP transistors may be used if appropriate modifications well known in the art are employed). The collector of transistor 21 is cross-coupled to the base of transistor 22 by means of a pair of back-to-back diodes 23 and 24 and a series resistor 26. The collector of transistor 22 is similarly cross-coupled to the base of transistor 21 by means of a pair of back-to-back diodes 27 and 28 and a series resistor 29. The collectors of transistors 21 and 22 are also respectively connected to load resistors 31 and 32, in turn commonly connected to a collector bias terminal 33 for connection in the present embodiment to a positive bias supply. The negative terminals of diodes 23 and 27 are connected to the collectors of the transistors and the positive terminals are connected to the positive terminals of diodes 24 and 28 and through resistors 34 and 36 to the bias terminal 33. The cross-coupled connections of the transistors afforded by diodes 24 and 28 and resistors 26 and 29 are conventional, while the diodes 23 and 27 and resistors 34 and 36 are included in the coupling networks for novel purposes subsequently described.

The flip-flop further includes base bias resistors 37 and 38 respectively connected between the bases of transistors 21 and 22 and ground.

The flip-flop transistors serve to drive buffer transistors 42 and 43 for developing relatively large output load driving capability in response to their being switched on and off in synchronism with the flip-flop transistors. In the illustrated case, the buffer transistors 42 and 43 are type NPN and respectively have their bases connected to the emitters of transistors 21 and 22 and their emitters connected to ground. The collectors of the buffer transistors 42 and 43 are coupled by means of load resistors 44 and 46 to the bias terminal 33. The output terminals 18 and 19 are connected to the collectors of the buffer transistors.

When one flip-flop transistor 21 is conducting, the base of the corresponding buffer transistor 42 is rendered relatively more positive than ground and this buffer transistor is therefore also conducting. By virtue of the cross-coupling between the flip-flop transistors, the base of the other transistor 22 is at this time at substantially ground potential. Transistor 22 is therefore turned off and the base of the corresponding buffer transistor 43 is at ground potential, thereby maintaining this transistor as well "off." When a negative signal is applied to the base of the conducting flip-flop transistor 21, this transistor is turned off, causing the potential at the base of the buffer transistor 42 to become substantially ground and turn the buffer transistor off. With transistor 21 off, the positive potential at bias terminal 33 appears at the collector. A positive potential is cross-coupled to the base of transistor 22 to thereby render same conducting. The corresponding buffer transistor 43 is thereby rendered conducting in the manner described relative to transistors 21 and 42. Responsive to a negative signal applied to the base of transistor 22, this transistor is turned off, transistor 43 is turned off, and transistors 21 and 42 are turned on in the manner described relative to the application of a negative signal applied to the base of transistor 21. It is to be noted that when either of the buffer transistors is conducting, the collector is substantially at ground potential. When either buffer transistor is turned off, the collector potential is substantially that of bias terminal 33. Thus, the potential swing at output terminals 18 and 19 responsive to switching of the flip-flop between its set and reset states is relatively large.

In order to store information in the flip-flop, information must first be entered into either the "set" or "reset" terminal 14 or 16 respectively. Coincidence between an information pulse at a set or reset terminal and a positive clock pulse causes the information to be entered into the temporary storage elements 12 or 13. At the time the clock goes from positive to zero, the information stored in the temporary storage element 12 or 13 is transferred to the storage flip-flop.

For example, to enter information at the set terminal 14, the terminal must be at ground potential. At this time, if the voltage at clock terminal 17 goes positive, a charge is stored in the capacitor 12 as a result of current flowing from clock terminal 17 through the capacitor 12, resistor 54 and diode 57 to ground at terminal 14. The voltage at the capacitor 12 is positive at terminal 17 and relatively negative with respect to terminal 17 at the junction of resistors 54 and 49, capacitor 12, and the emitter of transistor 61. At the time the clock goes from positive to zero, the voltage at that junction goes more negative, thus drawing current from the bases of flip-flop transistor 21 and of buffer transistor 42; this turns off both transistors 21 and 42 simultaneously. The information is thus transferred into the storage flip-flop.

When the entry is completed, the capacitor 12 can be quickly recovered to its normal state by simply letting the set terminal 14 go to a positive potential. In this case, capacitor 12 is recovered by current flowing from terminal 14 into the base of transistor 47 where it is amplified by the transistor 47. A current as large as the $h_{FE}$ of transistor 47 times its base current is available at the emitter of transistor 47 for rapid recovery of the capacitor 12 through resistor 49. The resistor 49 is used to limit current flow. Analogous action takes place when information is entered at R input.

It is to be noted that normally the storage capacitors 12 and 13 would be only coupled to the flip-flop transistors 21 and 22, and that the corresponding switching of the buffer transistors 42 and 43 would then occur purely by the action of the flip-flop transistors. The amount of base current which can flow out of the bases of the buffer transistors is therefore normally limited, with the result that turn-off of the buffer transistors is slow even though turn-off of the flip-flop transistors is fast. In accordance with the present invention, this problem is obviated by providing for simultaneous turn-off of both the flip-flop and buffer transistors with independent base current paths coupled to the storage capacitors. More particularly, the base of flip-flop transistor 21 is coupled to the positive terminal of a steering diode 59, the negative terminal of which is connected to the collector of a coupling transistor 61. In the illustrated case, transistor 61 is NPN. Its emitter is connected to the junction between storage capacitor 12 and resistor 49. The base of transistor 61 is connected to the junction between the base of buffer transistor 42 and emitter of flip-flop transistor 21. Similarly, the base of flip-flop transistor 22 is coupled by means of a steering diode 62 to the collector of an NPN coupling transistor 63. The emitter of this transistor is connected to the junction between storage capacitor 13 and resistor 51, while the base is connected to the junction between the base of buffer transistor 43 and emitter of flip-flop transistor 22. The operation of both coupling transistors is the same; they simultaneously provide independent paths for the base currents of the flip-flop and buffer transistors during turn-off. Therefore, the operation of only one side of the circuit is described below.

Assuming that flip-flop and buffer transistors 21 and 42 are conducting, a negative charge is placed on storage capacitor 12 in response to data at the synchronous set terminal 14 combined with a clock pulse at clock terminal 17. The emitter of coupling transistor 61 is thus negative and this transistor is rendered conducting. Current flows out of the base of flip-flop transistor 21 through the emitter-collector path of transistor 61 and steering diode 59. Simultaneously, current flows out of the base of buffer transistor 42 through the emitter-base path of transistor 61. The flip-flop and buffer transistors are simultaneously turned off rapidly by virtue of the turn-off base current paths simultaneously established.

In order to provide adequate current to drive the transistors 42 and 43, the flip-flop load resistors 31 and 32 should be relatively small. However, where these load resistors are small, too much base drive is provided for the flip-flop transistors 22 and 21 and large storage capacitors are required to effect switching of the flip-flop transistors from one state to the other. This problem is overcome in the instant circuit by means of the previously noted resistors 34 and 36 and diodes 23 and 27. Resistors 34 and 36 are selected to be substantially larger than resistors 31 and 32. Thus, although relatively small resistors 31 and 32 are provided in the collector circuits of the flip-flop transistors 21 and 22 such that a relatively high level of base current is provided to the bases of the buffer transistors 42 and 43, these small resistors are isolated from the base circuits of the opposite flip-flop transistors 22 and 21 by means of the diodes 23 and 27. Instead, the relatively large resistors 34 and 36 are presented to the base circuits of transistors 22 and 21, and these resistors are isolated from the collector circuits of transistors 21 and 22.

The circuit of the present invention may be further advantageously provided with direct set and direct reset terminals 64 and 66 to effect direct switching of the circuit from one state to the other exclusive of signal conditions at the synchronous set and reset terminals 14 and 16 and clock terminal 17. Direct set terminal 64 is advantageously coupled by means of a reverse biased diode 67 to the base circuit of flip-flop transistor 21, while direct reset terminal 66 is similarly coupled by diode 68 to the base circuit of flip-flop transistor 22. Thus, when transistor 21 is conducting and transistor 22 is off, a negative pulse applied to direct set terminal 64 renders the base of transistor 21 negative to thereby turn same off, whereupon transistor 22 is turned on by regenerative action. Conversely, when transistor 22 is conducting, a negative pulse at direct reset terminal 66 causes the base of such transistor to go negative. Transistor 22 is thus turned off and transistor 21 is turned on.

There is thus provided by the present invention a high-speed pulsed binary that includes a bistable flip-flop comprising transistors 21 and 22 as a permanent storage element, and capacitors 12 and 13 as temporary storage elements. The buffer transistors 42 and 43 correspondingly driven by the flip-flop transistors provide substantial load driving capacity at output terminals 18 and 19 during switching of the circuit between set and reset conditions. Rapid simultaneous switching of the flip-flop and buffer transistors is attained by the combined effects of the use of relatively small load resistors 31 and 32 in the collector circuits of the flip-flop resistors, and the transistors 61 and 63 simultaneously providing separate base current paths to both the flip-flop and buffer transistors. Rapid recovery of the storage capacitors to store subsequent information is provided by the use of relatively small storage capacitors 12 and 13 and relatively small resistors 49 and 51. Small storage capacitors may be employed by virtue of the limitation imposed on the base current drive to the flip-flop transistors 21 and 22 by the relatively large resistors 34 and 36 which are isolated from the collectors of the flip-flop transistors by means of the diodes 23 and 27. Small resistors 49 and 51 may be employed without excessive loading of drivers connected to the synchronous set and reset terminals 14 and 16 by virtue of the action of transistors 47 and 48. It should also be noted that the high speed pulsed binary circuit of the present invention is of a design that may be readily integrated in a single monolithic silicon chip.

Without intent to limit the scope of the invention as set forth in the claims, below is one specific set of values of the components used in the circuit of the drawing.

TABLE OF VALUES

| | |
|---|---|
| Capacitors **12, 13** ____pf__ | 50 |
| Resistors: | |
| **44, 46** | 1KΩ |
| **31, 32** | 2K |
| **34, 36** | 4.5K |
| **29, 26** | 500Ω |
| **37, 38** | 5K |
| **39, 41** | 750Ω |
| **54, 56** | 100Ω |
| **52, 53** | 3K |
| **49, 51** | 1K |
| Operating supply voltage ____v__ | 6 |
| Signal levels: | |
| Logical "high" level ____v__ | $\geqslant 2$ |
| Logical "low" level ____v__ | $\leqslant 0.5$ |
| Transistors | 2N2368 |
| Diodes | FD700 |

Although the invention has been described hereinbefore with reference to a single preferred embodiment, it will be appreciated that numerous changes and variations may be made therein without departing from the true spirit and scope of the invention. For example, PNP transistors may be employed in the circuit upon appropriate reversal of bias. Thus, it is not intended to limit the invention except by the terms of the appended claims.

What is claimed is:

1. In a flip-flop circuit having a first and second cross-coupled flip-flop transistors, three input terminals, one being for receipt of clock pulses, and the others being for receipt of set and reset input signals, and a pair of temporary storage capacitors each having two terminals, one capacitor coupled between the clock pulse input terminal and the base of one of said flip-flop transistors, and the other capacitor coupled between said clock pulse input terminal and the base of the other of said flip-flop transistors, the improvement comprising:

a pair of coupling means, one coupling the set input terminal to the terminal of one of said capacitors which is coupled to the base of one of said flip-flop transistors, and the other coupling the reset input terminal to the terminal of the other of said capacitors which is coupled to the base of the other of said flip-flop transistors, each of said pair of coupling means including the emitter-base junction of a coupling transistor and a resistance in series with said junction both said coupling transistors being biased to provide current gain.

2. The improvement set forth in claim 1 further characterized by said capacitors being diode-coupled to the bases of said flip-flop transistors.

3. In a buffered flip-flop circuit having first and second cross-coupled flip-flop transistors, three input terminals, one being for receipt of clock pulses, and the others being for receipt of set and reset input signals, a pair of temporary storage capacitors each having two terminals, one capacitor coupled between the clock pulse input terminal and the base of one of said flip-flop transistors, and the other capacitor coupled between said clock pulse input terminal and the base of the other of said flip-flop transistors, and a pair of buffer transistors, the base of each of said buffer transistors coupled respectively to one of the emitters of one of said flip-flop transistors, the improvement comprising:

a pair of coupling means, one coupling the set input terminal to the terminal of one of said capacitors which is coupled to the base of one of said flip-flop transistors, and the other coupling the reset input terminal to the terminal of the other of said capacitors which is couplied to the base of the other of said flip-flop transistors, each of said pair of coupling means including the emitter-base junction of a coupling transistor and a resistance in series with said junction, both said coupling transistors being biased to provide current gain.

4. In a buffered flip-flop circuit having first and second cross-coupled flip-flop transistors, three input terminals, one being for receipt of clock pulses, and the others being for receipt of set and reset input signals, a pair of temporary storage capacitors each having two terminals, one capacitor coupled between the clock pulse input terminal and the base of one of said flip-flop transistors, and the other capacitor coupled between said clock pulse input terminal and the base of the other of said flip-flop transistors, and a pair of buffer transistors; the base of each of said buffer transistors coupled respectively to one of the emitters of one of said flip-flop transistors, the improvement comprising:

a pair of coupling transistors each having a base, an emitter, and a collector, the emitter-collector circuits of each of said coupling transistors coupling the base of one of said flip-flop transistors to one terminal of one of said capacitors, and the emitter-base circuits of each of said coupling transistors coupling the base of one of the buffer transistors to said one terminal of one of said capacitors.

5. In a buffered flip-flop circuit having first and second cross-coupled flip-flop transistors, three input terminals, one being for receipt of clock pulses, and the others being for receipt of set and reset input signals, a pair of temporary storage capacitors each having two terminals, one capacitor coupled between the clock pulse input terminal and the base of one of said flip-flop transistors, and the other capacitor coupled between said clock pulse input terminal and the base of the other of said flip-flop transistors, and a pair of buffer transistors, the base of each of said buffer transistors coupled respectively to one of the emitters of one of said flip-flop transistors, the improvement comprising:

a pair of coupling means, one coupling the set input terminal to the terminal of one of said capacitors which is coupled to the base of one of said flip-flop transistors, and the other coupling the reset input terminal to the terminal of the other of said capacitors which is coupled to the base of the other of said flip-flop transistors, each of said pair of coupling means including the emitter-base junction of a first coupling transistor and a resistance in series with said junction, both said first coupling transistors being biased to provide current gain; and a second pair of coupling transistors the emitter-collector circuits of each of said second pair of coupling transistors coupling the base of one of said flip-flop transistors to one terminal of one of said capacitors, and the emitter-base circuits of each of said second pair of coupling transistors coupling the base of one of the buffer transistors to said one terminal of one of said capacitors.

6. A high speed pulsed binary comprising first and second transistors coupled in a flip-flop configuration, third and fourth transistors respectively responsively coupled to said first and second transistors for conduction of said third transistor responsive to conduction of said first transistor and conduction of said fourth transistor responsive to conduction of said second transistor, fifth and sixth transistors connected as buffer transistors, the base electrodes of each of said fifth and sixth transistors coupled respectively to the emitters of said first and second transistors, synchronous set and reset terminals, a clock pulse terminal, first and second storage capacitors having first sides connected to said clock pulse terminal and second sides respectively coupled to said set and reset terminals, said first and second capacitors respectively developing charges on said second sides thereof, for controlling switching of said first and second transistors in response to input information at said set and reset terminals in coincidence with pulses at said clock terminal, means coupling said second side of said first capacitor to said third transistor to simultaneously provide separate base current conduction paths thereto to switch said first and third transistors in response to a charge on said first capacitor, means coupling said second side of said second capacitor to said fourth transistor to simultaneously provide separate base current conduction paths thereto to switch said second and fourth transistors in response to a charge on said second capacitor, and first and second low resistance load means respectively coupled to said set terminal and first capacitor and to said reset terminal and second capacitor to rapidly discharge said capacitors while presenting high resistances to said set and reset terminals.

7. A high speed pulsed binary according to claim 6, wherein said means coupling said second side of said first capacitor to said first and third transistors comprises a fifth transistor having its emitter-collector path in series with the base of said first transistor and said first capacitor and its base connected to the base of said third transistor, and said means coupling said second side of said second capacitor to said second and fourth transistors comprises a sixth transistor having its emitter-collect path in series with the base of said second transistor and said second capacitor and its base connected to the base of said fourth transistor.

8. A high speed pulsed binary according to claim 6, wherein said first load means comprises a seventh transistor having emitter, collector, and base electrodes, and a load resistor of low value, said load resistor and the emitter-collector path of said seventh transistor connected in series with said second side of said first capacitor, said base of said seventh transistor coupled to said set terminal, and said second load means comprises an eighth transistor having emitter, collector, and base electrodes, and a second load resistor of low value, said second load resistor and the emitter-collector path of said eighth transistor connected in series with said second side of said second capacitor, said base of said eighth transistor coupled to said reset terminal.

9. A high speed pulsed binary according to claim 6, further defined by direct set and direct reset terminals respectively coupled to the bases of said first and second transistors.

10. A high speed pulsed binary comprising first and second flip-flop transistors, each having emitter, collector, and base electrodes, means cross-coupling the collectors and bases of said first and second transistors respectively, first and second load resistors respectively connecting the collectors of said first and second transistors to a bias terminal, first and second bias resistors connecting the bases of said first and second transistors to ground, third and fourth buffer transistors each having emitter, collector, and base electrodes, said emitters of said third and fourth transistors coupled to ground, said bases of said buffer transistors respectively connected to the emitters of said first and second transistors, third and fourth bias resistors respectively coupling the bases of said third and fourth transistors to ground, third and fourth load resistors respectively coupling the collectors of said third and fourth transistors to said bias terminal, first and second storage capacitors, a clock pulse terminal connected to first sides of said capacitors, synchronous set and reset terminals respectively coupled to second sides of said first and second capacitors, fifth and sixth coupling transistors each having emitter, collector, and base electrodes, said base electrodes of said fifth and sixth transistors respectively connected to the base electrodes of said third and fourth transistors, said emitter electrodes of said fifth and sixth transistors respectively connected to said second sides of said first and second capacitors, and means coupling the collector electrodes of said fifth and sixth transistors to the base electrodes of said first and second transistors.

11. A high speed binary according to claim 10, further defined by first and second low resistance load means respectively coupling said synchronous set and reset terminals to said second sides of said first and second capacitors to rapidly discharge said capacitors while presenting high resistances to said set and reset terminals.

12. A high speed binary according to claim 10, wherein said cross-coupling means includes first and second back-to-back diodes coupling said collector of said first transistor to said base of said second transistor, third and fourth back-to-back diodes coupling sand collector of said second transistor to said base of said first transistor, and fifth and sixth load resistors respectively coupling said bias terminal in forward biasing relation to the common junction between said first and second diodes and to the common junction between said third and fourth diodes, said fifth and sixth load resistors being of substantially larger value than said first and second load resistors.

13. A high speed pulsed binary according to claim 11, further defined by said first low resistance load means comprising a seventh transistor having emitter, collector, and base electrodes, said base electrodes of said seventh transistor connected to said synchronous set terminal, said collector electrode of said seventh transistor connected to said bias terminal, a fifth bias resistor connecting the base of said seventh transistor to said bias terminal, and a seventh low resistance load resistor connecting said emitter of said seventh transistor to said second side of said first capacitor, and said second low resistance load means comprising an eighth transistor having emitter, collector, and base electrodes, said base electrode of said eighth transistor connected to said synchronous reset terminal, said collector electrode of said eighth transistor connected to said bias terminal, a sixth bias resistor connecting the base of said eighth transistor to said bias terminal, and an eighth low resistance load resistor connecting said emitter of said eighth transistor to said second side of said second capacitor.

14. A high speed pulsed binary according to claim 13, further defined by said cross coupling means including first and second back-to-back diodes coupling said collector of said first transistor to said base of said second transistor, third and fourth back-to-back diodes coupling said collector of said second transistor to said base of said first transistor, and fifth and sixth load resistors respectively coupling said bias terminal in forward biasing relation to the common junction between said first and second diodes and to the common junction between said third and fourth diodes, said fifth and sixth load resistors being of substantially larger value than said first and second load resistors.

15. A high speed pulsed binary according to claim 14, further defined by direct set and direct reset terminals respectively coupled to the base electrodes of said first and second transistors.

No references cited.

ARTHUR GAUSS, *Primary Examiner.*

J. D. FREW, *Assistant Examiner.*

U.S. Cl. X.R.

307—247, 289, 291